United States Patent
Pikus et al.

(10) Patent No.: US 7,716,611 B2
(45) Date of Patent: May 11, 2010

(54) LOGIC INJECTION

(75) Inventors: Fedor G. Pikus, Beaverton, OR (US);
Kobi Kresh, Portland, OR (US)

(73) Assignee: Mentor Graphics Corporation,
Wilsonville, OR (US)

( * ) Notice: Subject to any disclaimer, the term of this patent is extended or adjusted under 35 U.S.C. 154(b) by 0 days.

(21) Appl. No.: 10/987,947

(22) Filed: Nov. 13, 2004

(65) Prior Publication Data

US 2006/0107240 A1 May 18, 2006

(51) Int. Cl.
*G06F 17/50* (2006.01)
*G06F 9/45* (2006.01)
*G06F 9/455* (2006.01)

(52) U.S. Cl. ............... 716/2; 716/4; 716/5; 716/11
(58) Field of Classification Search ............. 716/12–14, 716/2, 4–5, 11
See application file for complete search history.

(56) References Cited

U.S. PATENT DOCUMENTS 5,249,133 A * 9/1993 Batra ........................ 716/5
6,574,779 B2 * 6/2003 Allen et al. .................. 716/1
2005/0216873 A1 * 9/2005 Singh et al. .................. 716/5

OTHER PUBLICATIONS

Kim et al.; "Hierarchical LVS based on hierarchy rebuilding"; Feb. 1998; INSPEC; All pages.*

* cited by examiner

*Primary Examiner*—Jack Chiang
*Assistant Examiner*—Suresh Memula
(74) *Attorney, Agent, or Firm*—Banner & Witcoff, Ltd.

(57) ABSTRACT

A technique for reducing a circuit listing. According to examples of the technique, at least a portion of a circuit listing is analyzed to identify occurrences of a circuit structure made up of a plurality of circuit components. For each identified occurrence of the defined circuit structure, an injection data object is created corresponding to the plurality of components, and the injection data object is substituted into the portion of the circuit listing in place of the plurality of components. For each occurrence of the defined structure, one or more properties of the occurrence of the defined structure may be determined and contained by the corresponding injection data object.

28 Claims, 9 Drawing Sheets

LOGIC INJECTION

FIELD OF THE INVENTION

The present invention relates to the evaluation of lists of components forming a microdevice. Various embodiments of the invention have particular application to the comparison of a netlist for a microcircuit layout with the circuit schematic from which the circuit layout was created.

BACKGROUND OF THE INVENTION

Microdevices are used in myriad ways. Microcircuits, for example, are used in a variety of devices from automobiles to microwaves to personal computers. Other types of microdevices, such as optical devices, photonic structures, mechanical machines or other micro-electromechanical systems (MEMS) and static storage devices show promise to be as important as microcircuit devices are currently. Designing and fabricating microdevices involve many steps. These steps, sometimes referred to as a "design flow," are highly dependent on the type of microdevice, the complexity, the design team, and the microdevice fabricator or foundry. For microcircuits, several steps are common to all design flows. First, a design specification is modeled logically, typically in a hardware design language (HDL). Software and hardware "tools" then verify the design at various stages of the design flow by running software simulators and/or hardware emulators, and errors in the design are identified and corrected.

After the logical design is satisfactory, it is converted into circuit design data by synthesis software. Preliminary estimates of timing may also be made at this stage using an assumed characteristic speed for each device. The circuit design data, which often takes the form of a listing of circuit components, represents the specific electronic devices, such as transistors, resistors, and capacitors, and their interconnections that will achieve the desired logical result. A simple form of this type of circuit listing is commonly referred to as a "netlist." A "netlist" typically describes the nodes or "nets" in a circuit, as well as the connection of device pins to those nets. Thus, a netlist can be viewed as corresponding to the level of representation displayed in typical circuit diagrams.

Once the relationships between circuit elements have been established, the design is again transformed, this time into the specific geometric elements that define the shapes that will occur to form the individual elements. Custom layout editors, such as Mentor Graphics' IC Station or Cadence's Virtuoso are commonly used for this task. Automated place and route tools can also be used to define the physical layouts, especially of wires that will be used to interconnect logical elements.

The physical design data represents the patterns that will be written onto the masks used to fabricate the desired microcircuit device, typically by photolithographic processes. Each layer of the integrated circuit has a corresponding layer representation in the physical database, and the geometric shapes described by the data in that layer representation define the relative locations of the circuit elements. For example, the shapes for the layer representation of an implant layer define the regions where doping will occur; the line shapes in the layer representation of an interconnect layer define the locations of the metal wires to connect elements, etc. because the physical design data, also called a "layout", is used to create the photomasks or reticles used in manufacturing, the data must conform to the requirements of the manufacturing facility, or "fab", that will manufacture the final devices. Each fab specifies its own physical design parameters for compliance with their process, equipment, and techniques.

It is very important that the physical design information accurately embody the logical design for proper performance. Accordingly, the design flow for a microcircuit will typically include a comparison of the physical layout with the original design schematic. More particularly, the topographical features of the masks are analyzed, to extract the circuit components and the interconnections between the components from the mask layout. The extracted information is arranged into a layout netlist. The extracted layout netlist can then be compared with the original schematic netlist, to ensure that the layout is accurate.

A very large integrated circuit device, however, might have millions and millions of components (for example, transistors) organized into logic gates, memories, programmable field arrays, and other circuits. Comparing two netlists for such a large device might be too consuming to perform on a component by component basis. In order to allow a computer to more easily process these large data structures (and to allow human users to better understand the data structures), the design data for a microcircuit device often is broken up into a hierarchical organization of cells. The six transistors making up one type of memory circuit for storing single bit, for example, may be categorized as a cell. A larger circuit structure containing one or more of these single-bit memory circuits may then be categorized as another cell having a higher hierarchy than the first cell. For example, eight single-bit memory circuits could be categorized as a byte memory circuit cell that includes eight single-bit memory circuit cells.

Thus, rather than having to individually compare each component of a layout circuit listing with its corresponding component in a schematic circuit listing, a layout circuit listing often is compared with a schematic circuit listing using a hierarchical cell (i.e., "h-cell") comparison process. Using this process, a cell in a schematic circuit listing is compared with its corresponding cell in a layout circuit listing on a component-by-component basis. As used herein, a pair of matching cells is referred to as a "h-cell pair," and either cell in a an h-cell pair is referred to as an "h-cell."

Once the accuracy of one instance of an h-cell in the layout circuit listing has been confirmed, the accuracy of the other instances of that h-cell is confirmed without requiring another comparison check. Further, a confirmed h-cell can be treated as a single component of another h-cell having a higher hierarchy. Accordingly, in the example, given above, once the accuracy of one single-bit memory circuit cell serving as an h-cell was confirmed with a component-by-component comparison, the accuracy of all other such single-bit memory circuit h-cells can be confirmed without requiring a transistor-by-transistor comparison. Further, a subsequent component-by-component comparison for a byte memory circuit h-cell would require the comparison of only eight components (that is, a comparison of only the eight single-bit memory circuit cells making up the byte memory circuit h-cell) rather than an individual comparison of all forty-eight transistors forming the byte memory circuit.

While the use of h-cells may allow circuit listings to be compared more efficiently, the difficulty in defining h-cells often present problems. Typically, an h-cell will be defined by a user or by employing a set of heuristics. These heuristics may, for example, look for naming similarities between portions of the layout circuit listing and portions of the schematic circuit listing, similarities in frequency of occurrence between portions of the layout circuit listing and portions of the schematic circuit listing, etc.

As a result, a cell in a layout circuit listing may not have a corresponding cell in a schematic circuit listing required to form an h-cell pair. Thus, with the previously-discussed example, a cell may be defined for the layout circuit listing that includes twelve transistors making up two single-bit memory circuits (i.e., forming a two-bit memory circuit). The schematic listing, however, may only define a cell that includes eighteen transistors making up three single-bit memory circuits (i.e., forming a three-bit memory circuit). With such as arrangement, the cells would not provide an h-cell pair that could be compared, and the circuit listings would still need to be compared on a transistor-by-transistor basis. Further, two different cells having the same or similar names may be designated as equivalents. Comparing this h-cell pair would thus always produce errors. Again, the circuit listings would still need to be compared on a transistor-by-transistor basis.

BRIEF SUMMARY OF THE INVENTION

Advantageously, various embodiments of the invention provide a technique for simplifying a circuit listing. For some embodiments of the invention, one or more structures are defined, with each defined structure being made up of multiple components. Some portion or all of a circuit listing then is analyzed to identify occurrences of the defined structures. When an occurrence of a defined structure is identified, an injection data object is generated that describes the logic of that structure. The injection data object is then "injected" into the circuit listing to replace the multiple components making up the defined structure.

With various embodiments of the invention, the injection data object may only represent the types of components making up the defined structure and their interconnections. For some circuit devices, however, a user may need to compare more than just the interconnections of devices. For example, a user may need to confirm that a circuit property in the layout, such as the length or width of a transistor, matches a circuit property specified in the original schematic. Accordingly, in various embodiments of the invention, the injection data object may additionally include one or more properties of the defined structure or of a component of the defined structure. By including such property information, an injection data object can accurately represent any desired features of a circuit structure. Thus, any desired circuit feature may be considered during a comparison of a layout circuit with its original schematic circuit.

For some embodiments of the invention, the injection data object may be a single data object. With other embodiments of the invention, however, the injection data object may itself be made up of multiple, smaller data objects. For example, with some embodiments of the invention, the injection data object may include one or more repeat information data objects and one or more specific information data objects. With this arrangement, a repeat information data object stores information common to multiple occurrences of the circuit structure represented by the injection data object. A specific information data object then stores information specific to the corresponding occurrence of the circuit structure, such as one or more properties associated with the circuit structure or a component of the circuit structure. The amount of memory required to store information for a single occurrence of the defined structure thus can be reduced. With some of these embodiments, the specific information data object may include a reference to the repeat information data object or vice versa. According to still other embodiments, however, the injection data object may further include a reference data object that contains both a reference to at least one specific information data object and a reference to at least one repeat information data object.

With some embodiments of the invention, the injection data object may also include an identification data object containing identification information or "handles" identifying each component represented by that injection data object (and, correspondingly, the structures represented by that injection data object.) The identification data object may, for example, contain an integer identifier corresponding to each component in the defined structure represented by the injection data object. Such an identifier can be used to, for example, reference a Cartesian coordinate location for a component within a circuit layout, the masks used to form the component, or other relevant information using a lookup table. A reference data object may then contain a reference to the specific information data object, a reference to the repeat information data object, and a reference to the identification data object.

Still further, in various embodiments of the invention the injection data object may include two or more repeat information data objects. For example, with some embodiments of the invention, the injection data object may include a prototype repeat information data object and at least one sub-prototype repeat information data object. The prototype repeat information data object contains information common to each occurrence of the defined structure represented by the injection data object. The sub-prototype repeat information data object then contains information common to only a smaller group of occurrences of that defined structure (i.e., common to only a subset of all of the occurrences of the defined structure.)

DETAILED DESCRIPTION OF THE INVENTION

Overview

In order to provide a better understanding of the different aspects of the invention, various embodiments of the invention will be described that may be used to compare the circuit listing of a circuit schematic for an integrated circuit with a circuit listing extracted from the layout of materials to implement the integrated circuit. Accordingly, a brief description of the process of comparing a schematic circuit listing with a layout circuit listing will be described, together with an example of one operating environment in which various embodiments of the invention may be implemented. The identification of defined structures in a circuit listing and the subsequent substitution of an injection data object for the identified defined structure will then be described. The various contents of an injection data object, such as properties for the represented structure, as well as various data structures that can be used to implement an injection data object according to different embodiments of the invention, also will be described.

Schematic And Layout Circuit Listings

Figure 1:
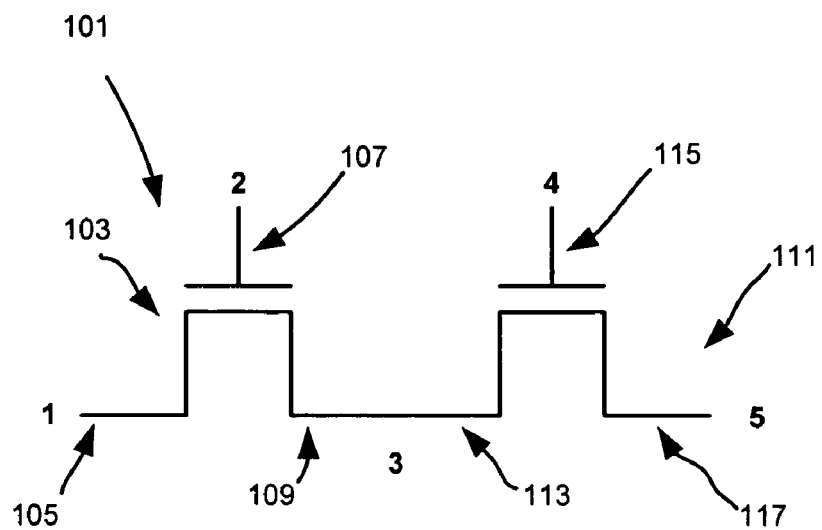
FIG. 1 shows a schematic diagram of a circuit.

Turning now to FIG. 1, this figure illustrates a schematic diagram representing a simple electronic circuit 101. As seen in this figure, the circuit 101 includes a field effect transistor 103, having a drain 105 (labeled as connection point "1"), a gate 107 (labeled as connection point "2"), and a source 109 (labeled as connection point "3"). The circuit 101 also includes a second field effect transistor 111 (connected at connection point "3") to the field effect transistor 103. The field effect transistor 111 includes a drain 113 (also labeled as connection point "3"), a gate 115 (labeled as connection point "4"), and a source 117 labeled as connection point "5").

While schematic diagrams of the type shown in FIG. 1 are useful in understanding the operation of a circuit, they cannot be directly employed to actually create an integrated circuit. Instead, circuit layouts are made based upon the circuit schematic. The layout defines polygons corresponding to the arrangement of materials forming the actual structure of the circuit. The layout may then be used to form, for example, one or more lithographic images for manufacturing the topography of the circuit.

Figure 2:
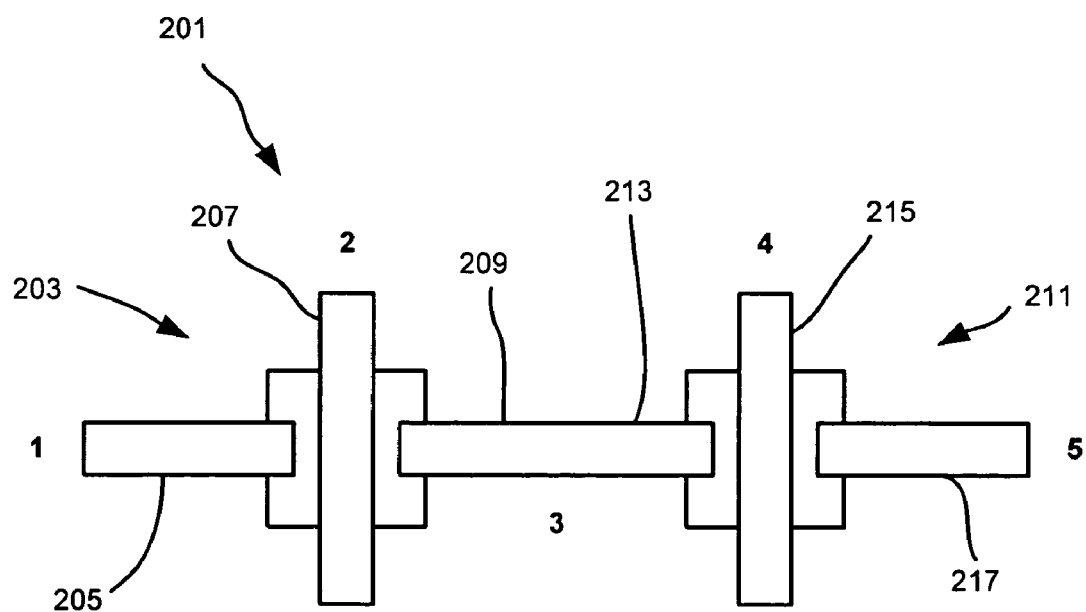
FIG. 2 shows a layout diagram corresponding to the circuit represented in FIG. 1.

For example, FIG. 2 illustrates a simplified example layout diagram 201 for physically implementing the electronic circuit 101 shown FIG. 1. The layout diagram 201 includes a field effect transistor 203 corresponding to the field effect transistor 103, and a field effect transistor 211 corresponding to the field effect transistor 111. The transistor 203 includes a polygon 205 illustrating the layout of materials that will be used to form the drain 105, a polygon 207 corresponding to the layout of materials used to form the gate 107, and a polygon 209 corresponding to the layout of materials used to form the source 109. Similarly, the transistor 211 includes a polygon 213 illustrating the layout of materials that will be used to form the drain 113, a polygon 215 corresponding to the layout of materials used to form the gate 115, and a polygon 217 corresponding to the layout of materials used to form the source 117.

As will be appreciated by those of ordinary skill in the art, while schematic diagrams of the type illustrated in FIG. 1 and layout diagrams of the type illustrated in FIG. 2 may be useful for understanding simple electronic devices, they are too unwieldy to be effectively used to describe large integrated circuits. Instead, various data structures, such as circuit listings, are used to describe both the information shown in schematic diagrams and layout diagrams. An example of a simple circuit listing for the circuit show in FIG. 1, sometimes referred to as a "netlist," is shown below:

| M1 | 1 | 2 | 3 | P |
| M2 | 3 | 4 | 5 | N |

The first line of the netlist identifies the field effect transistor 103 as device M1, and indicates that this transistor is a P-type transistor. It also indicates that the drain 105 of the transistor 103 is connected to a "net" or connection point "1", the gate 107 is connected to connection point "2", and that the source 109 is connected to connection point "3". The second line of the netlist refers to the second field effect transistor 111 as M2, and indicates that this transistor is an N-type transistor. The second line of the netlist also indicates that the drain 113 of the field effect transistor 111 is also connected to connection point "3" (and thus to the source 109 of the field effect transistor 103), that the gate 115 is connected to connection point "4", and that the source 117 is connected to connection point "5". Accordingly, the netlist describes the relevant characteristics of the circuit 101 defined in the schematic diagram shown in FIG. 1.

Similarly, various types of data structures can be used to describe the information illustrated in a circuit layout diagram. For example, the GDSII data format is employed to describe the polygon information defined in a circuit layout. This type of data format may be automatically employed by, for example, a photolithograph device to create material structures corresponding to polygons defined in the layout. As will also be appreciated by those of ordinary skill in the art, the information shown in a layout may also be converted into a netlist like that noted above. The netlist of a layout may, for example, be translated or "extracted" from the GDSII format.

Comparison of a Layout with the Original Schematic

Thus, a schematic may be employed to design the functions of a circuit, and a layout then formed from the schematic to produce the circuit. While the layout is typically formed from the original schematic, however, the layout may contain significant differences from the schematic. When producing a layout, for example, various changes to the original design may be made to optimize the use of surface area on an integrated circuit. A final layout for a circuit may therefore include errors that will cause the circuit to operate differently from the operation described in the original schematic.

Accordingly, before a layout is used to actually produce an integrated circuit, the final version of the layout is checked against the original schematic upon which it is based, to ensure that the layout is accurate. For example, a final layout in the GDSII format may be translated or "extracted" into a circuit listing, such as a netlist format. An example of a tool capable of performing this type of extraction process is the CALIBRE software tool available from Mentor Graphics Corporation of Wilsonville, Oreg. The extracted circuit listing is then compared to a circuit listing describing the original schematic.

In view of the size of modern integrated circuits, however, it is very difficult to compare each element of a schematic netlist with each element of the corresponding layout netlist. For example, an integrated circuit forming a programmable microprocessor may include hundreds of millions of transistors. Comparing netlist data for each transistor thus might require an impractical amount of time and use of resources to complete. Instead, both the schematic netlist and the layout netlist are organized into a hierarchical structure containing different levels of reoccurring cells. That is, combinations of circuit components that repeatedly occur in a specific arrangement can be collected into a single unit, referred to as a hierarchical cell. These cells can then be used in an h-cell comparison process to reduce the number of operations and memory space required to compare the layout netlist with the schematic netlist.

For example, if a group of circuit components are regularly organized to form memory circuits, then these can be collected into an h-cell. An h-cell pair can then be used as a single data unit for the comparison between the schematic netlist and the layout netlist, rather than comparing every device in the memory circuit. More particularly, when executing the task of comparing the schematic netlist with the layout netlist, the components of an h-cell in the schematic netlist can be compared with the components of the corresponding h-cell in the layout netlist. If the components are found to be equivalent, then the cells can thereafter be treated as equivalents without further comparison. Thus, each time the h-cell reoccurs in the layout netlist, its components will not be compared again to components in the schematic netlist.

Figure 3:
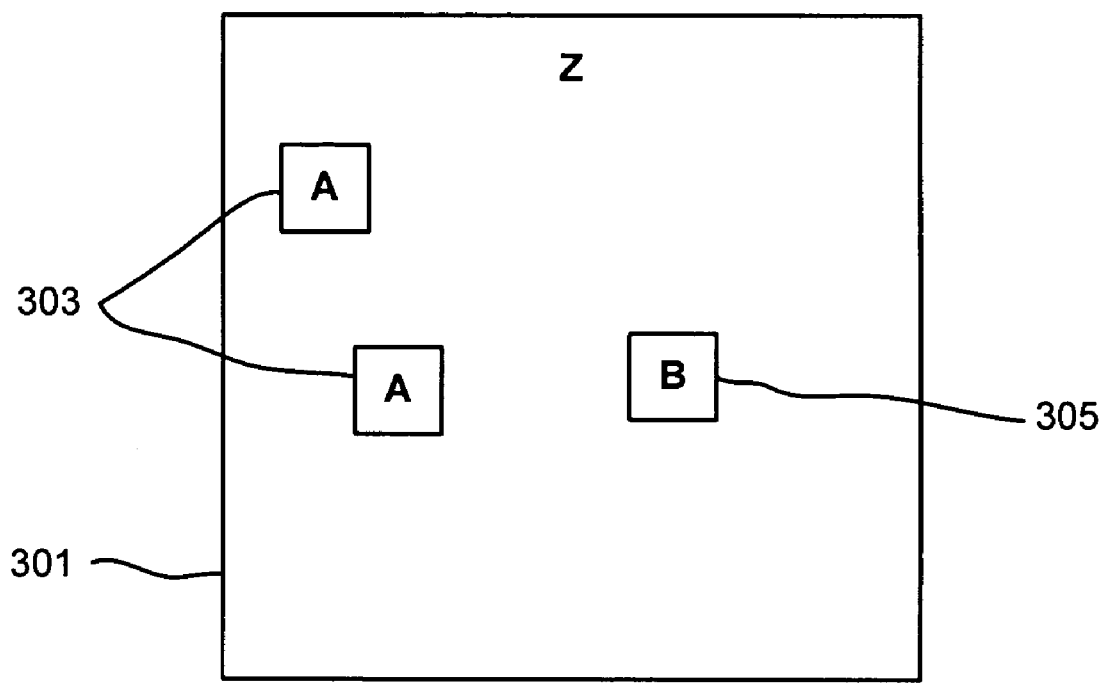
FIG. 3 illustrates an example of the hierarchy of cells.

A cell, such as an h-cell, may itself contain other cells (including other h-cells), thereby forming a hierarchical data structure. For example, FIG. 3 illustrates a cell 301 (labeled as cell "Z"). The cell 301 in turn includes a plurality of instances of a cell 303 (labeled as cell "A") and a single instance of a cell 305 (labeled as cell "B"). An example of a netlist corresponding to the cell "A" is shown below:

| .subckt | | A | 1 | 2 | |
|---|---|---|---|---|---|
| M1 | 1 | | 3 | 4 | P |
| M2 | 4 | | 5 | 2 | N |
| .end | | | | | |

Thus, the netlist defines the cell "A" as being connected to connection points 1 and 2, and having a P-type device with connections at points 1, 3, and 4 and an N-type device having connections at points 4, 5, and 2.

Similarly, an example netlist corresponding to the cell "Z" incorporating the cell "A" is shown below:

| .subckt | | Z | 10 | 20 | 30 | 40 |
|---|---|---|---|---|---|---|
| X1 | 10 | 20 | A | | | |
| X2 | 20 | 30 | A | | | |
| X3 | 30 | 40 | B | | | |
| | | • | | | | |
| | | • | | | | |
| | | • | | | | |
| .end | | | | | | |

Thus, this netlist defines the cell "Z" as having connections or "pins" at connection points 10, 20, 30 and 40. It also defines the first component of the cell "Z" as an instance of cell "A" with connections or "pins" at points 10 and 20, defines the second component of the cell "Z" as an instance of cell "A" with connections at points 20 and 30, and defines the third component of the cell "Z" as an instance of cell "B" with connections at points 30 and 40.

In order to clarify the structure of cells, the terms "element" or "elementary device" will be used hereafter to refer to a portion of a data structure that cannot be subdivided into smaller portions according to the hierarchical arrangement of the data structure. For example, in the circuit structure 101 shown in FIG. 1, each of the transistors 103 and 111 are elements of the circuit. The term "cell" will then be used to refer any portion of a data structure that can be further subdivided into smaller portions according to the hierarchical arrangement of the data structure. The term "component" will then be generically used to refer to both "cells" and "elements" or "elementary devices." Thus, the components of cell may be one or more other cells, one or more elementary devices, or a combination of both.

While the use of cells can substantially reduce the number of comparison operations required to compare a layout netlist (or other data structure) with a schematic netlist (or other data structure), the cells to be compared must first be determined. That is, equivalent cell pairs (referred to as an "h-cell" pair) in the schematic netlist and the layout netlist must first be identified before they can be compared for accuracy in executing the comparison task.

H-cell pairs can be selected in a variety of ways. For example, because the layout netlist may be derived from the original schematic, netlist equivalent cells in the schematic netlist and the layout netlist may share the same or similar names. Alternately, the h-cell pairs may be designated by a user. This technique for designating h-cell pairs may be useful, where, for example, a user has employed standard cell methodology to create the schematic data structure, the layout data structure, or both. Also, heuristics may be employed to match h-cell pairs between a schematic data structure and a layout data structure. For example, if both the schematic data structure and the layout data structure include a cell that has exactly 523 instances, then those cells are probably equivalent, and thus may be designated as an h-cell pair.

While the use of h-cells can substantially decrease the processing overhead in comparing a schematic netlist with a layout netlist, the selection of an incorrect h-cell pair can create significant errors in the comparison task. For example, if an h-cell in the schematic netlist is erroneously indicated as part of an h-cell pair with a non-equivalent cell in the layout netlist, then the comparison task will provide an error indicating that the cells are not equivalent. A user, however, would be unable to determine whether the error was created because the layout netlist actually contained an error, or because the two cells were, in fact, not equivalent and should not have been compared.

Also, a cell in a layout netlist may not have an equivalent cell in a schematic netlist. For example, a byte memory circuit (that is, a memory circuit for storing eight bits of information) will include eight one-bit memory circuits. In a schematic netlist, each pair of one-bit memory circuits may be organized into a cell. In the layout circuit, however, four one-bit memory circuits may be organized into a cell. Thus, the cells making up a byte memory circuit in the layout netlist cannot form h-cell pairs with the cells making up a byte memory circuit in the schematic netlist.

In response to these errors, the components of each cell must be compared on a component-by-component basis in the context of a higher level parent cell. If the cells are not equivalent, the parent cells may likewise not be equivalent, and thus other yet-higher-level parent cells, if any, will need to be compared on a component-by-component basis. This process of expanding cells may continue until the comparison task becomes impractically long.

To address these problems with conventional h-cell comparison processes, various embodiments of the invention analyze each netlist for patterns corresponding to a specific structure. When the occurrence of a structure is identified, the components making up that structure in the circuit listing are replaced with an injection data object representing the logic of the replace components. Because this process is performed for both the layout netlist and the schematic netlist, an injection data object for the occurrence of a circuit structure in the layout netlist will correspond to the injection data object representing the same occurrence of that structure in the schematic netlist. Accordingly, if there is a discrepancy between the two data objects, the discrepancy arises from an actual difference between the layout and the original schematic, rather than from a mismatched h-cell pair designation.

Various embodiments of the invention may additionally allow an injection data object to store any desired properties of a corresponding structure. For example, various embodiments of the invention may provide an injection data object capable of storing one or more properties of the entire structure represented by the data object, such as power consumption or timing requirements. Alternately or additionally, various embodiments of the invention may provide an injection data object capable of storing one or more properties of particular components of the structure corresponding to the injection data object. For example, with some embodiments of the invention, the injection data object can store the length or width of a transistor. The injection data object may additionally store, e.g., the area of a transistor's source, the area of a transistor's drain, the perimeter of a transistor's source, the perimeter of a transistor's drain, a transistor's slew rate, etc. Some embodiments of the invention may alternately or additionally permit a user to specify which properties of a circuit structure (or a particular component of a circuit structure) that will be stored by an injection data object. These features of the invention advantageously allow a comparison of two injection data objects to reveal subtle discrepancies between circuit structures that might not otherwise be detected using many conventional comparison techniques, such as conventional h-cell comparison techniques.

With some embodiments, the logic injection techniques according to the invention can be used in place of conventional h-cell techniques. Alternately, various embodiments of the invention may advantageously employ logic injection techniques according to the invention in conjunction with conventional h-cell comparison techniques, in order to obtain the benefit offered by both techniques. In addition, various embodiments of the invention may be employed to simplify or reduce the size of a single circuit for other purposes, such as to reduce the memory storage required to store or process a circuit listing.

Operating Environment

Figure 4:
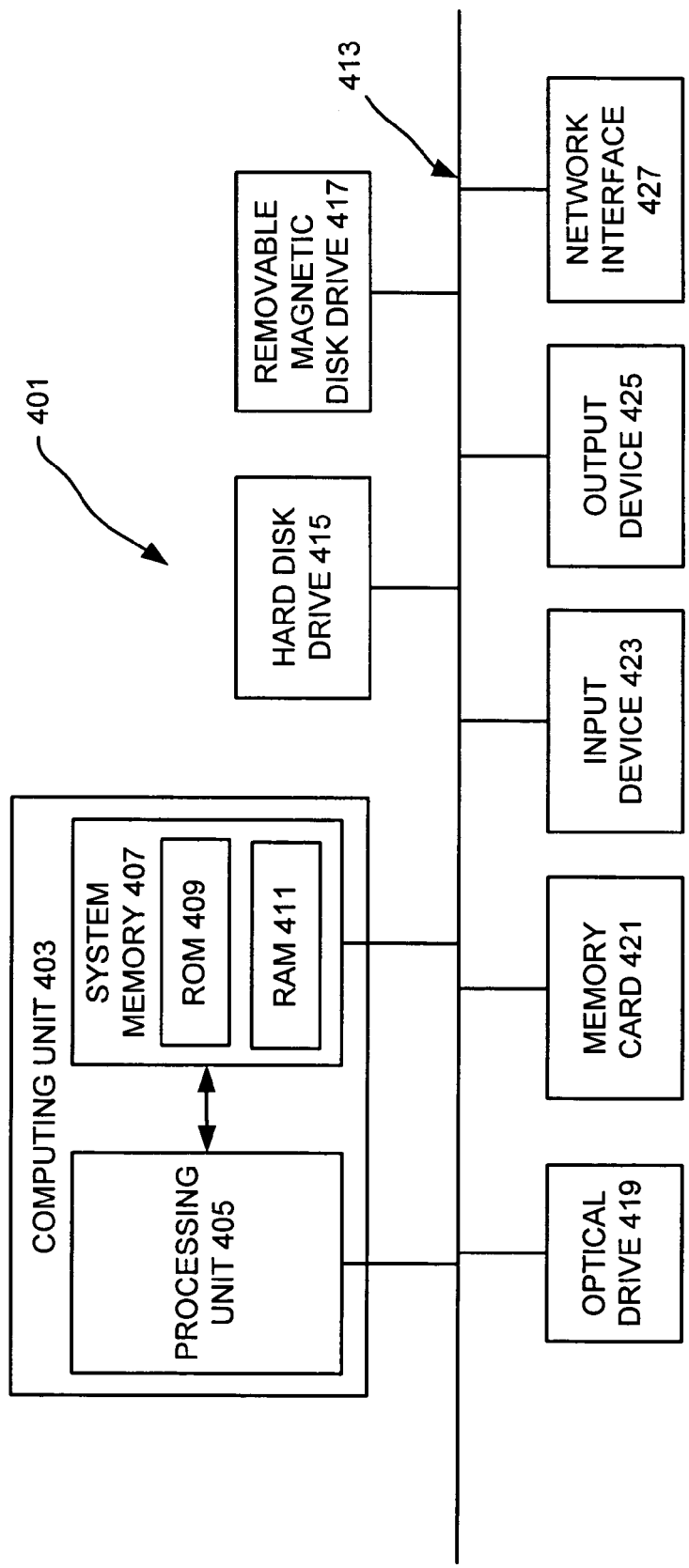
FIG. 4 illustrates one embodiment of a programmable computer that may be used to implement various embodiments of the invention.

Various embodiments of the invention may be implemented through a data structure stored in memory medium, the execution of software instructions by a computing device, such as a programmable computer, or a combination thereof. An illustrative example of a computing device 401 that may be used to implement various embodiments of the invention is illustrated in FIG. 4. As seen in this figure, the computing device 401 has a computing unit 403. The computing unit 403 typically includes a processing unit 405 and a system memory 407. The processing unit 405 may be any type of processing device for executing software instructions, but will conventionally be a microprocessor device. The system memory 407 may include both a read-only memory (ROM) 409 and a random access memory (RAM) 411. As will be appreciated by those of ordinary skill in the art, both the read-only memory (ROM) 409 and the random access memory (RAM) 411 may store software instructions for execution by the processing unit 405.

The processing unit 405 and the system memory 407 are connected, either directly or indirectly, through a bus 413 or alternate communication structure, to one or more peripheral devices. For example, the processing unit 405 or the system memory 407 may be directly or indirectly connected to one or more additional memory storage devices, such as a hard disk drive 415, a removable magnetic disk drive 417, an optical disk drive 419, or a flash memory card 421. The processing unit 405 and the system memory 407 also may be directly or indirectly connected to one or more input devices 423 and one or more output devices 425. The input devices 423 may include, for example, a keyboard, a pointing device (such as a mouse, touchpad, stylus, trackball, or joystick), a scanner, a camera, and a microphone. The output devices 425 may include, for example, a monitor display, a printer and speakers.

With some implementations, the computing unit 403 may be directly or indirectly connected to one or more network interfaces 427 for communicating with a network. The network interface 427 translates data and control signals from the computing unit 403 into network messages according to one or more communication protocols, such as the transmission control protocol (TCP), the user datagram protocol (UDP), and the Internet protocol (IP). These and other conventional communication protocols are well known in the art, and thus will not be discussed here in more detail. An interface 427 may employ any suitable connection agent (or combination of agents) for connecting to a network, including, for example, a wireless transceiver, a modem, or an Ethernet connection.

It should be appreciated that one or more of these peripheral devices may be housed with the computing unit 403 and bus 413. Alternately or additionally, one or more of these peripheral devices may be housed separately from the computing unit 403 and bus 413, and then connected (either directly or indirectly) to the bus 413. Also, it should be appreciated that both computers and computing appliances may include any of the components illustrated in FIG. 4, may include only a subset of the components illustrated in FIG. 4, or may include an alternate combination of components, including some components that are not shown in FIG. 4.

As previously noted, various embodiments of the invention may be implemented using a data structure stored in memory medium, the execution of software instructions stored in a memory medium by a computing device, or a combination thereof. For example, some embodiments of the invention may be implemented using a variation of the CALIBRE software tool available from Mentor Graphics Corporation of Wilsonville, Oreg.

Logic Injection Tool

Figure 5:
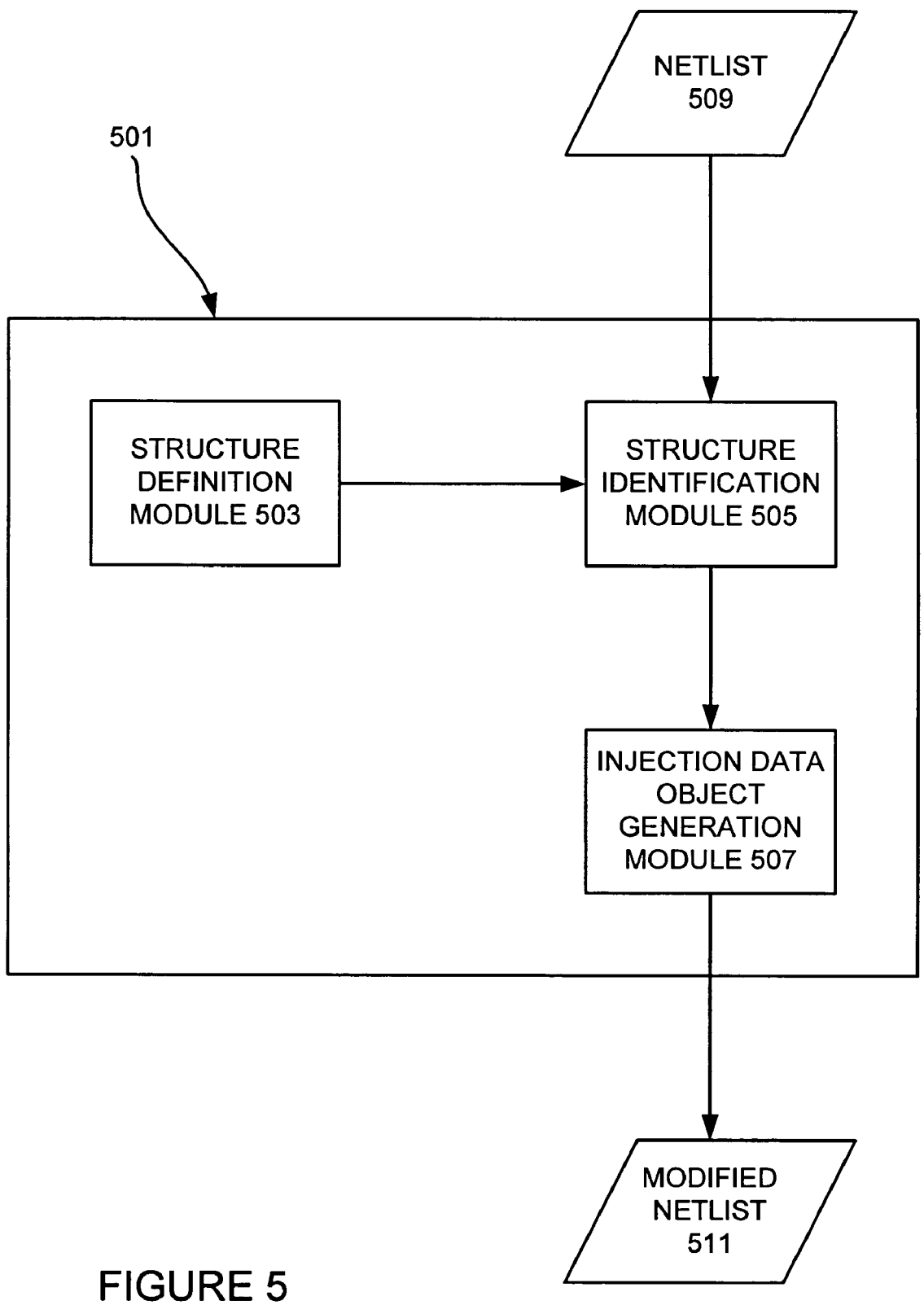
FIG. 5 shows an example of a logic injection tool according to various embodiments of the invention.
Figure 6A:
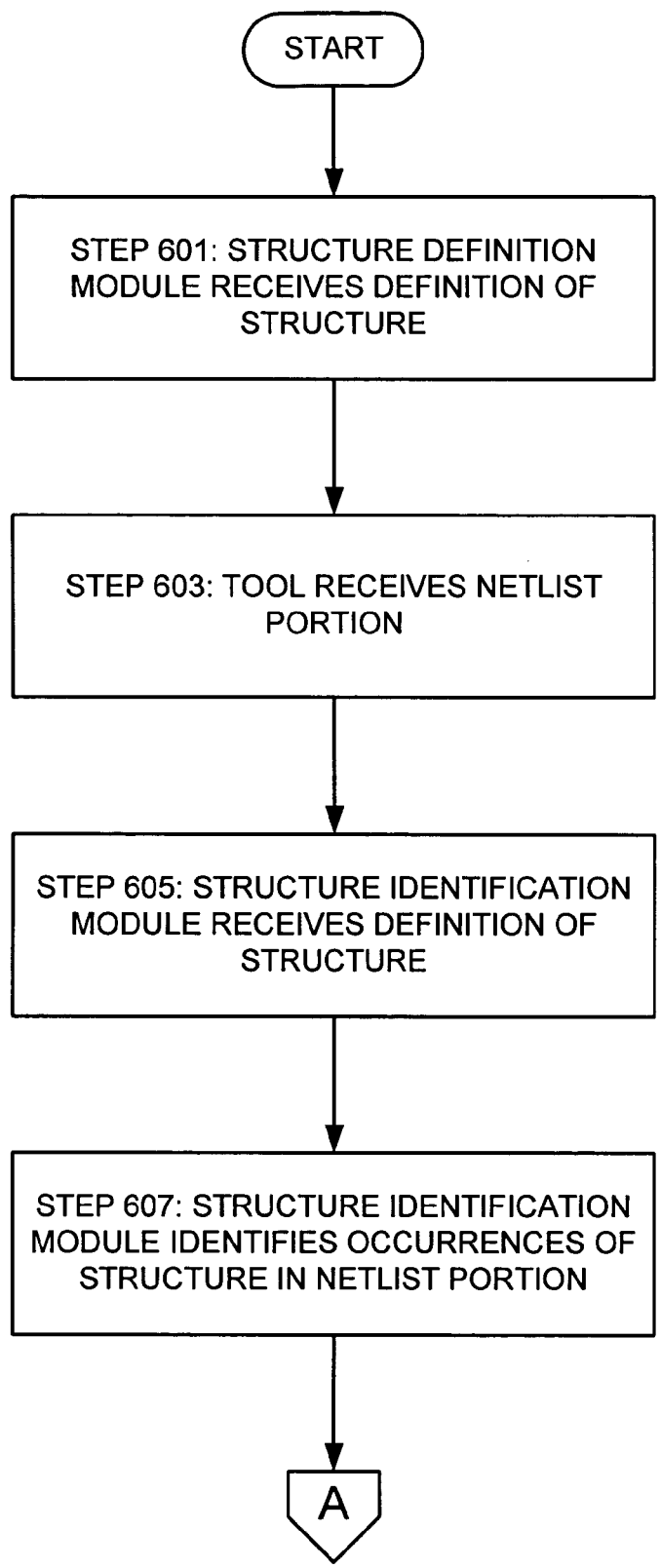
FIGS. 6A and 6B illustrate a flowchart describing a method of logic insertion according to various embodiments of the invention.
Figure 6B:
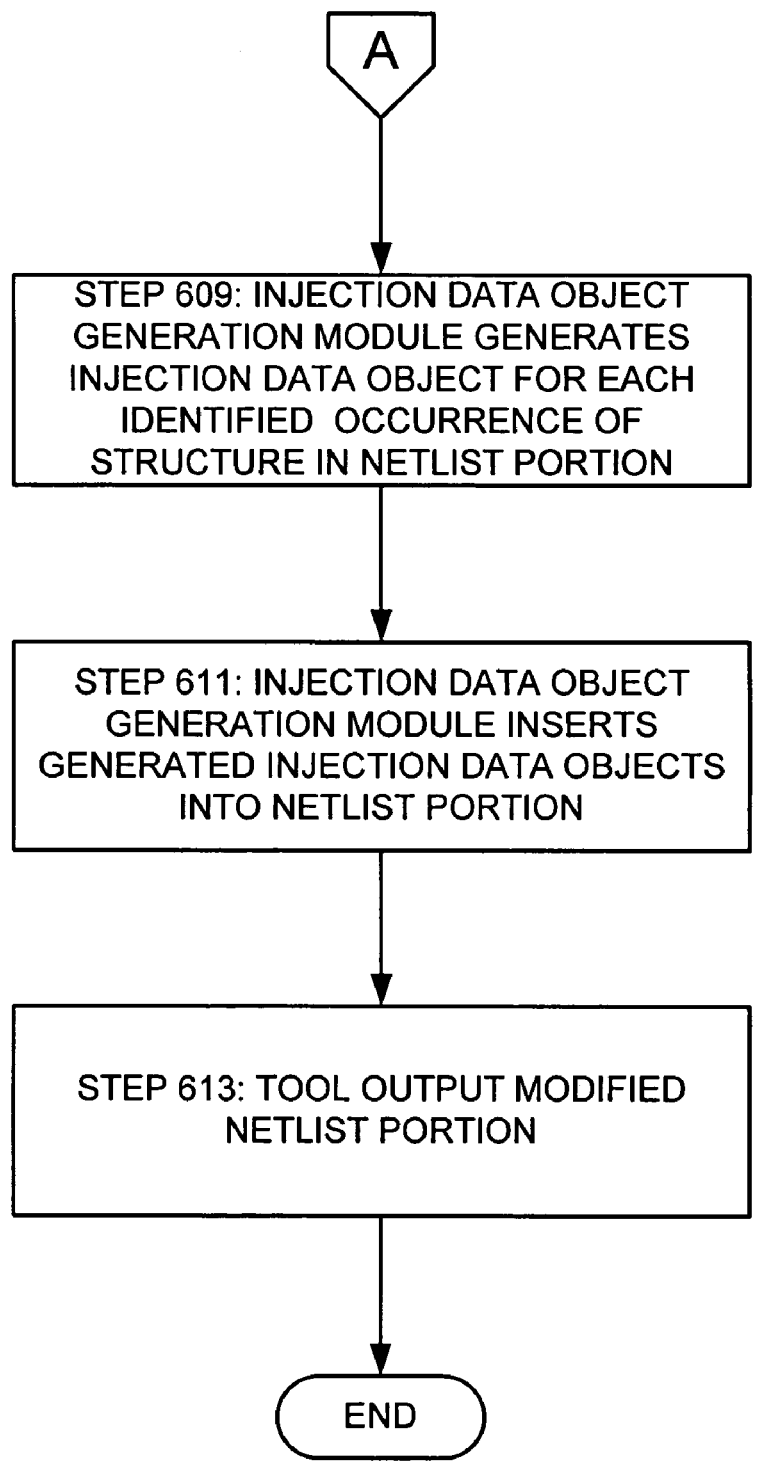

FIG. 5 illustrates an example of a logic injection tool 501 according to various embodiments of the invention. As seen in this figure, the logic injection tool 501 includes a structure definition module 503, a structure identification module 505, and an injection data object generation module 507. As previously noted, one or more of these modules may be implemented by a programmable computer executing a set of software instructions to perform the function of that module, a data structure stored in memory, or a combination of both. The operation of the tool 501 now will be explained with reference to the flowchart shown in FIGS. 6A and 6B.

The structure definition module 503 stores the definition of the circuit structures that will be replaced with an injection data object. Accordingly, in step 601, the structure definition module 503 receives a definition of a structure to be identified in a circuit listing, such as a netlist. With some embodiments of the invention, one or more of these circuit structure definitions may be "hard-wired" (or "hard-coded") into the device or data structure used to implement the structure definition module 503. Alternately or additionally, some embodiments of the invention may allow a user to create or delete circuit structure definitions from the structure definition module 503 as desired. Still further, various embodiments of the invention may allow a user to modify an existing circuit structure definition as desired.

Figure 7:
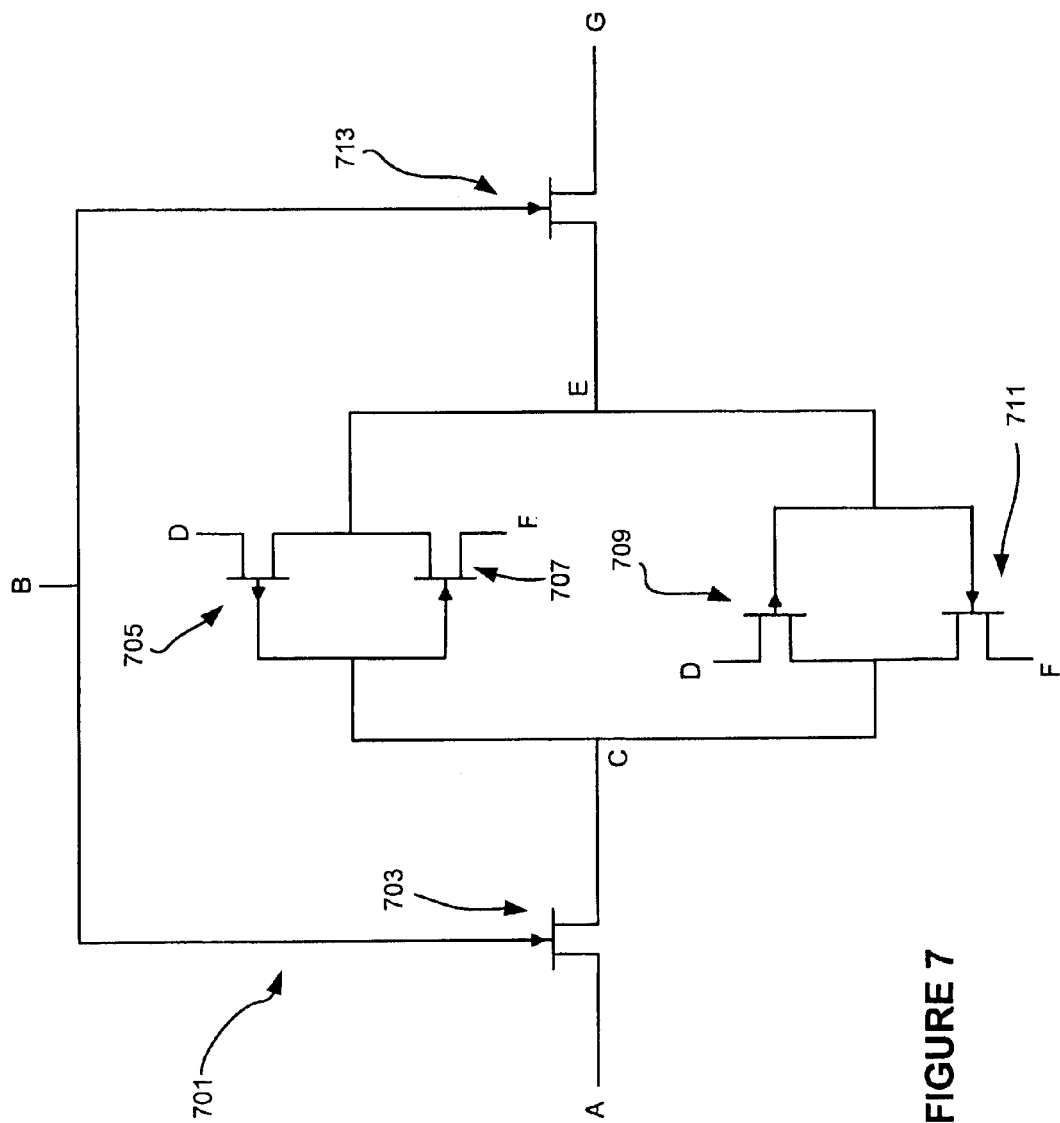
FIG. 7 illustrates an example of a circuit structure that can be identified and replaced by a logic injection tool according to various embodiments of the invention.

FIG. 7 illustrates one example of a possible structure that may be defined in the structure definition module 503. More particularly, FIG. 7 illustrates a circuit structure 701 that may be used as a memory circuit for storing a single bit of information in a memory device. This single-bit memory circuit 701 includes a field effect transistor (FET) 703, a P-type FET 705, an N-type FET 707, a P-type FET 709, an N-type FET 711, and an FET 713. In the illustrated embodiment, both the FET 703 and the FET 713 are shown as N-type FETs. It should be noted, however, that variations of the circuit structure 701 may have P-type FETs for the FET 703 and the FET 713, or some combination of N-type and P-type FETs for the FET 703 and the FET 713.

With this circuit structure, the source pin of transistor 703 is connected to net 1, while the gate pin of transistor 703 is connected to net B and the drain pin of transistor 703 is connected to net C. For transistor 705, its source pin is connected to net E, its gate pin is connected to net 38, and its drain pin is connected to net D. With transistor 707, its source pin is connected to net F, its gate pin is connected to net 38, and its drain pin is connected to net E. For transistor 709, its source pin is connected to net D, its gate pin is connected to net E, and its drain pin is connected to net 38, while for transistor 711, its source pin is connected to net 38, its gate pin is connected to gate E, and its drain pin is connected to net F. Lastly, with transistor 713, its source pin is connected to net E, its gate pin is connected to net B, and its drain pin is connected to net G.

As will be appreciated by those of ordinary skill in the art, a generic circuit listing (e.g., a netlist) can be created which describes the number and general type of components making up this structure (i.e., transistors), and the interconnections of these components. An example of such a generic netlist is shown below, where references M1-M6 refer to transistors 703-713, respectively.

| M1 | C | B | A |
| M2 | D | C | E |
| M3 | E | C | F |
| M4 | C | E | G |
| M5 | H | E | C |
| M6 | I | B | E |

Accordingly, the structure definition module 503 may store this type of circuit listing information as a generic representation for the structure shown in FIG. 7.

It should be noted that various embodiments of the invention will allow the structure definition module 503 to store information defining multiple structures as desired. For example, with some embodiments of the invention, the structure definition module 503 may store information defining a both variety of memory circuits, like the one-bit memory circuit shown in FIG. 7, and a variety of logic gates, such as NAND gates, NOR gates, and inverters. Also, while the particular example of a circuit structure 701 described above is made up of transistors, the structure definition module 503 may store the definition of a circuit structure made up of any combination of circuit elements, including transistors, capacitors, resistors, inductors, switches, etc.

In addition, the structure definition module 503 according to various embodiments of the invention may store circuit structures made up of smaller circuit structures, including circuit structures also defined in the structure definition module 503. Accordingly, a circuit structure stored in the structure definition module 503 may include one or more references to insertion data objects. For example, the structure definition module 503 may include a definition for the single-bit memory circuit 701. The structure definition module 503 may also include a definition for a circuit structure corresponding to a row of 1024 single-bit memory circuits 701. Thus, the definition for the row of 1024 single-bit memory circuits 701 would include data representing 1024 data objects corresponding to a single-bit memory circuit 701. Accordingly, the terms "element" or "elementary device" will be used hereafter to refer to a portion of a circuit structure that cannot be subdivided into smaller portions that can be defined in the structure definition module 503. The term "component" will then be generically used to refer to "elements" or "elementary devices" and references to injection data objects. Thus, the components of a defined circuit structure may include one or more elementary devices, one or more injection data objects, or a combination of both.

In step 603, the tool 503 receives at least a portion of a circuit listing, such as a section of a netlist. As noted above, various embodiments of the invention may employ the logic injection techniques provided by the tool 501 in conjunction with h-cell comparison techniques. Accordingly, for some applications, a user may select to employ the tool 501 with only the portion of a circuit listing containing a particular h-cell, or other specific portion of a larger circuit listing. Alternately, however, the user can apply the tool 501 to identify and replace defined structures throughout an entire circuit listing.

Next, in step 605, the structure identification module 505 receives the definition of a structure from the structure definition module 503. Then, in step 607, the structure identification module 505 employs the structure definition information to identify each occurrence of the defined structure in the received netlist portion. For example, the structure identification module 505 may compare a generic netlist, such as that described above for the single-bit memory circuit 701, with each line of the netlist portion. The structure identification module 505 then will identify each pattern of lines in the received netlist portion that matches the identification netlist received from the structure definition module 503.

In step 611, the injection data object generation module 507 generates an injection data object corresponding to each occurrence of the defined structure identified in the netlist portion. As will be discussed in detail below, the injection data object contains information representing the structure as it is described in the netlist portion. Accordingly, the injection data object generation module 507 analyzes the identified portion of the netlist, and extracts relevant information from the identified portion of the netlist. For example, as will be discussed in detail below, the injection data object generation module 507 may extract a name for the occurrence of defined structure. It may also extract names or other handles for the individual components making up the occurrence of the defined structure. Still further, the injection data object generation module 507 will extract any desired properties specific to that particular occurrence of the defined circuit structure.

For some occurrences of circuit structure, the particular grouping of components making up that occurrence may be topologically ambiguous. Accordingly, various embodiments of the invention may exclude these occurrences from the logic injection process. For example, the injection data object generation module 507 may be required to resolve a topological ambiguity for an occurrence of a circuit structure in a layout circuit listing. If the injection data object generation module 507 might then resolve the topological ambiguity for the corresponding occurrence of the circuit structure in a schematic circuit listing way in a different way, both occurrences of the circuit structure may be excluded from the logic injection process to prevent a subsequent erroneous comparison.

Also, it should be noted that some defined circuit structures may have intrinsic topological symmetry. For these defined circuit structures, two or more pins for the structure may be swappable. For example, in the single-bit memory circuit 701, the pin corresponding to net A is interchangeable or "swappable" with the pin corresponding to net G. Thus, an occurrence of the single-bit memory circuit 701 in a layout circuit listing may have pin A connected to a point X and pin G connected to a point Y. The corresponding occurrence of the single-bit memory circuit 701 in the original schematic circuit listing may then have pin A connected to a point Y and pin G connected to a point X. Because pins A and G are swappable for this circuit structure, the connection differences between the corresponding occurrences of these circuits should not be considered an error. Accordingly, the injection data object generation module 507 may generate the injection data object so that it contains pin swappability information, such as rules governing the swappability of pins.

In some embodiments, the injection data object generation module 507 will create an injection data object made up of only a single data object. As will be discussed in more detail below, in some embodiments of the invention the injection data object generation module 507 may create an injection data object that includes one or more smaller data objects. Accordingly, with these embodiments, the injection data object generation module 507 will create any new data objects and identify any existing data objects that will be required to represent the particular occurrence of the defined circuit structure.

For example, the injection data object generation module 507 may create one or more data objects containing (or otherwise representing) information associated with a particular occurrence of the defined circuit structure, such as the names and properties associated with the particular occurrence of the defined circuit structure. The injection data object generation module 507 may identify (or create, as necessary) one or more data objects containing (or otherwise representing) information that the particular occurrence of the defined circuit structure may share with other occurrences of the defined circuit structure. The injection data object generation module 507 will then create a data object that refers to the other data objects making up the injection data object.

The injection data object generation module 507 also will insert at least a portion of each generated injection data object into the received netlist portion. More particularly, for each identified occurrence of the defined structure in the netlist portion, the injection data object generation module 507 replaces the components of that structure (e.g., the netlist lines representing those components) with at least a portion of the injection data object corresponding to those components. For example, if an injection data object is made up of a single data object, the injection data object generation module 507 will inject the entire injection data object (or a reference to the entire injection data object) into the circuit listing. If, however, an injection data object is made up multiple smaller single data objects, then the injection data object generation module 507 will inject a reference to these smaller data objects (or a reference to another reference these smaller data objects) into the circuit listing.

Internal nets in a defined circuit structure are nets that are not connected to pins of an injected component. Accordingly, these nets may be removed from the circuit listing along with the components making up the circuit structure. If an internal net is named and may be used as an initial correspondence point for matching the contents of two injection data objects, then the logic injection process for the net may be suppressed and the net name preserved in the circuit listing.

In this manner, the injection data object generation module 507 modifies the received netlist portion by replacing multiple components making up a defined circuit structure with the logic of a single injection data object. Then, in step 613, the tool 501 outputs the modified netlist portion.

As discussed in detail above, this modified netlist portion can be compared with another, similarly modified netlist portion during, for example, a layout versus schematic netlist comparison process. By reducing the number of components in the modified netlist from the received netlist portion, the tool 501 may substantially increase the speed of the comparison process while reducing the amount of memory required to perform such a process.

The Injection Data Object

As previously noted, various embodiments of the invention may create an injection data object made up of a single data object for each occurrence of a defined circuit structure. Conventionally, however, multiple occurrences of a defined circuit structure will share one or more features, such as topology and component types. Accordingly, to reduce the amount of memory required to store the injection data objects in a modified circuit listing, various embodiments of the invention may generate injection data objects that share smaller data objects.

Figure 8:
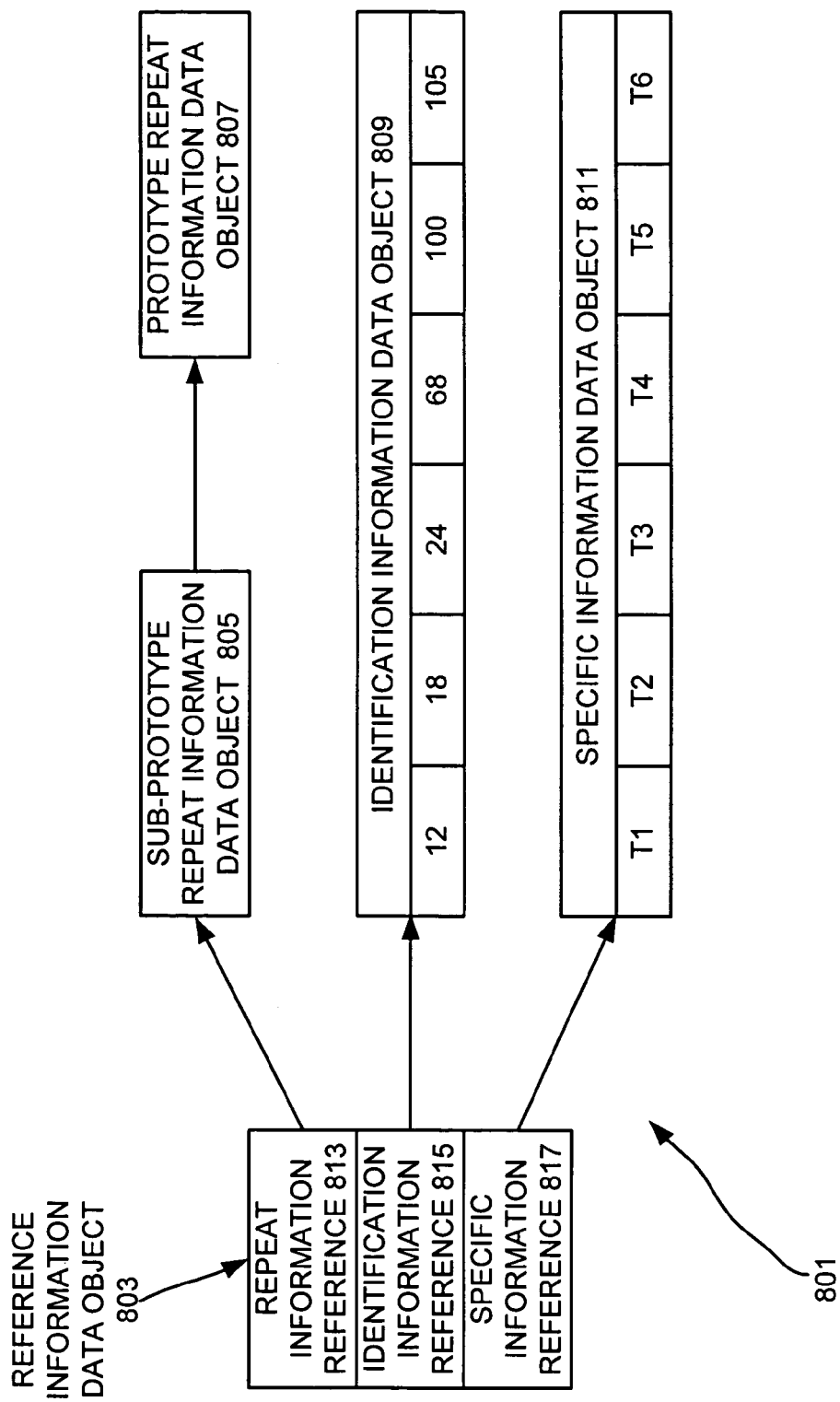
FIGS. 8-10 illustrate how the use of logic injection according to various embodiments of the invention can simplify a circuit listing.

FIG. 8 illustrates one example of a data structure that may be employed to implement an injection data object according to various embodiments of the invention. As seen in this figure, the injection data object 801 is made up of a reference information data object 803, a sub-prototype repeat information data object 805, a prototype repeat information data object 807, an identification information data object 809 and a specific information data object 811. The reference information data object then stores a repeat information reference 813 referencing the sub-prototype information data object 805, an identification information reference 815 referencing the identification information object 809, and a specific information reference 817 referencing the specific information data object 811. With some embodiments of the invention, one or more of the references 813-817 may be pointer to a particular location, a hash value, or a combination of both.

The sub-prototype repeat information data object 805 and the prototype repeat information data object 807 contain information that is common to multiple occurrences of a defined structure. More particularly, the prototype repeat information data object 807 contains information that is common to every occurrence of a defined circuit structure. For example, the prototype repeat information data object may include a generic name for the defined circuit structure, the topology for the defined circuit structure, the pins or ports of for the defined circuit structure, and the swappability (if any) for these pins or ports. Further, the prototype repeat information data object 807 may contain (or otherwise provide) different combinations of the repeat information, in order to facilitate comparison of the prototype repeat information data object 807 with another prototype repeat information data object 807.

The sub-prototype repeat information data object 805 may then store information that is particular to a subset of occurrences of the defined data structure, as well as a reference or link to the prototype repeat information data object 807. For example, with the single-bit memory circuit structure 701 illustrated in FIG. 7, this circuit structure may occur millions of times in a netlist describing a memory device. For some of these occurrences, the structure may have the same N-type/P-type transistor combination shown in FIG. 7, where transistors 703 and 713 are N-type transistors. With other occurrences of this general circuit structure, however, the transistors 703 and 713 may be P-type transistors rather than N-type transistors.

Thus, occurrences of this structure in netlist may be organized into two sub-groups: single bit memory circuits using N-type transistors for both transistor 703 and transistor 713, and single bit memory circuits using P-type transistors for both transistor 703 and transistor 713. Accordingly, the prototype repeat information data object 807 will store the interconnection information common to every occurrence of the general connection structure shown in FIG. 7. The sub-prototype repeat information data object 805 will then store information specifying the features of the sub-group to which the corresponding occurrence of this single-bit memory circuit structure belongs. That is, one sub-prototype repeat information data object 805 will be referenced to indicate that an occurrence of the single-bit memory circuit employs N-type transistors for transistors 703 and 713, while another sub-prototype repeat information data object 805 will be referenced to indicate that an occurrence of the single-bit memory circuit employs P-type transistors for transistors 703 and 713. Still other sub-prototype repeat information data object 805 may be generated to indicate when an occurrence of the single-bit memory circuit employs a particular combination of N-type transistor and P-type transistor for transistors 703 and 713

By employing the sub-prototype information data object 805 and the repeat information data object 807, various embodiments of the invention can substantially reduce the amount of memory required to represent each occurrence of a circuit structure. More particularly, rather than repeating common information for each occurrence of a defined circuit structure, the injection data object representing an occurrence of a defined structure can simply refer to one instance of the sub-prototype repeat information data object 805, which in turn refers to one instance of the prototype repeat information data object 807. It should be appreciated, however, that with various embodiments of the invention, the sub-prototype repeat information data object 805 and the prototype repeat information data object 807 may be combined into a single repeat information data object. Alternately, the repeat information common to multiple occurrences of a circuit structure can be reorganized into three or more separate repeat information data objects 805, depending upon the number of groups into which the occurrences of the circuit structure can be categorized. Also, with some embodiments of the invention, a repeat information data object may be omitted entirely, and the repeat information stored within the reference information data object 803 or the specific information data object 811.

The identification information data object 809 includes identification information used to identify each component of a particular occurrence of a defined structure. For example, in the illustrated embodiment, the identification information data object includes six fields, each field storing an integer identifying a component in the netlist making up the occurrence of the defined circuit structure. The integer may, for example, reference a location in a table that stores Cartesian coordinates representing the location of the component (e.g., a transistor) in a layout. Alternately, the integer may reference a location in a table that stores a reference to a location in a circuit listing for a circuit schematic. Of course, still other techniques can be used to associate the contents of the identification information data object 809 with a particular circuit structure component. Thus, a user can identify a particular component of a defined circuit structure using the identification information in the identification information data object 809.

The specific information data object 811 then stores information specific to its corresponding occurrence of the defined data structure in the received netlist portion. For example, different occurrences of the single-bit memory circuit structure 701 shown in FIG. 7 may employ transistors with different lengths or widths. While this information may not be used in a conventional h-cell comparison process, a discrepancy in transistor size between a layout design and the original schematic design may create significant errors in the manufactured microcircuit. Accordingly, by identifying specific properties of an occurrence of a defined circuit structure in the specific information data object 811, a comparison process can take into account any desired properties of a circuit structure.

It should be noted that, while transistor length and width are to commonly employed properties of a circuit structure, with various embodiments of the invention the specific information data object 811 may include any desired property of a circuit structure. For example, some embodiments of the invention may create a specific information data object 811 containing one or more properties for the entire defined circuit structure, such as timing requirements or specifications for the entire circuit structure, power consumption for the entire circuit structure, maximum or minimum heat ratings for the entire structure, and the like. Alternately or additionally, with various embodiments of the invention a specific information data object 811 containing one or more properties for individual components of a defined circuit structure. For example, in addition to a transistor's width or length, the specific information data object 811 may contain the area of a transistor's source, the area of a transistor's drain, the perimeter of a transistor's source, the perimeter of a transistor's drain, a transistor's slew rate, etc.

With some embodiments, a specific information data object 811 may internally store all of the properties associated with a particular occurrence of a defined circuit structure. While various embodiment of the invention will ideally be capable of storing a unique set of properties for each occurrence if a defined circuit structure, however, different occurrences of a defined data structure will typically share one or more properties. For example, a memory device may include several million identical copies of the single-bit memory circuit 701, so that most if not all of the occurrences of this circuit structure will share the same properties. Accordingly, with other embodiments of the invention, a specific information data object 811 may contain one or more properties associated with a particular occurrence of a defined circuit structure by providing references to other data structures storing those properties. Thus, properties shared by multiple occurrences of the defined circuit structure may be stored in a single data structure that can be shared between multiple injection data objects.

Thus, as shown in FIG. 8, the corresponding specific information data object 811 for an occurrence of the single-bit memory circuit 701 may contain six references, each reference corresponding to a transistor making up the single-bit memory circuit 701. With some embodiments of the invention, the reference may be a hash value identifying a location storing the properties for the corresponding transistor. For other embodiments of the invention, however, the reference may be a pointer to a table storing the properties for the corresponding transistor. In this manner, properties shared among multiple occurrences of a defined circuit structure can be stored using a reduced amount of memory space.

Use of Logic Injection Techniques to Simplify and Compare Circuit Listings

Figure 9:
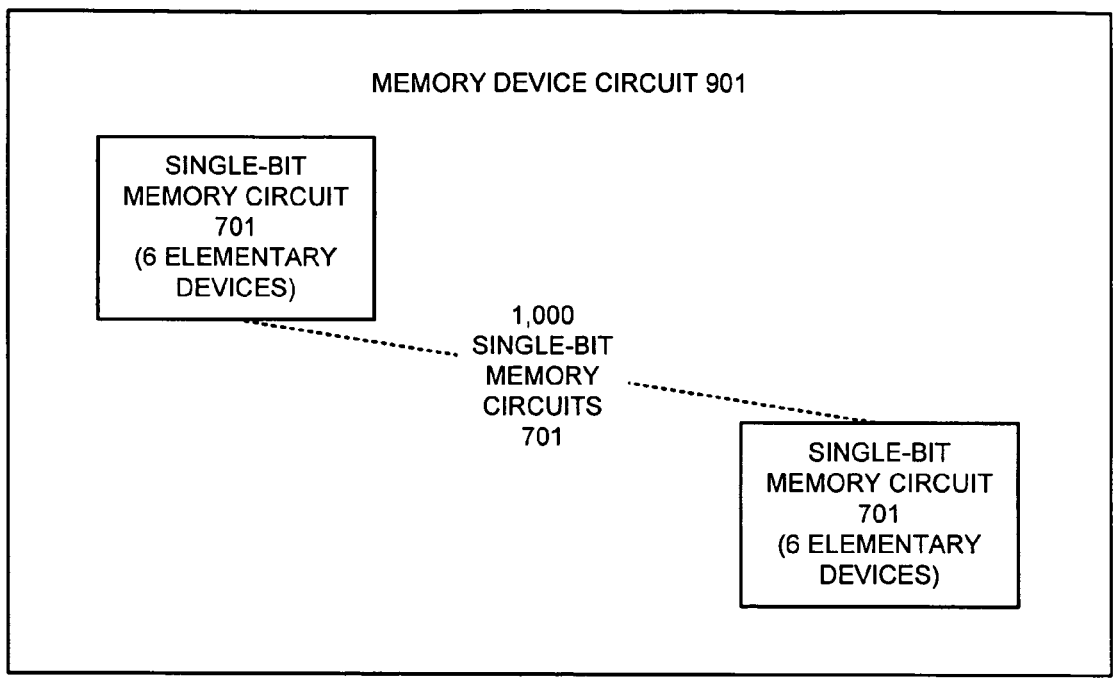

Turning now to FIG. 9, this figure illustrates a memory device circuit 901, which in turn contains several occurrences of the single-bit memory circuit 701. More particularly, the memory device circuit 901 contains 1,000 instances of the single-bit memory circuit 701, with each instance of the single-bit memory circuit 701 containing six components (i.e., six transistors). Thus, in order to compare a netlist representing this circuit (e.g., a layout netlist) with another netlist representing this circuit (e.g., a schematic netlist) on a component-by-component basis, 6,000 different comparison operations would need to be made.

To reduce this overhead, both netlists could be simplified using the tool 501 as described above. More particularly, if the structure definition module 503 provided a definition of the single-bit memory circuit 701, the structure identification module 505 would then identify each occurrence of the single-bit memory circuit 701. Further, injection data object generation module 507 would then replace each occurrence of the single-bit memory circuit 701 with an injection data object representing the logical equivalent of the six transistors making up the single-bit memory circuit 701. Accordingly, a subsequent comparison process with the simplified netlists would only require 1,000 comparison operations.

Figure 10:
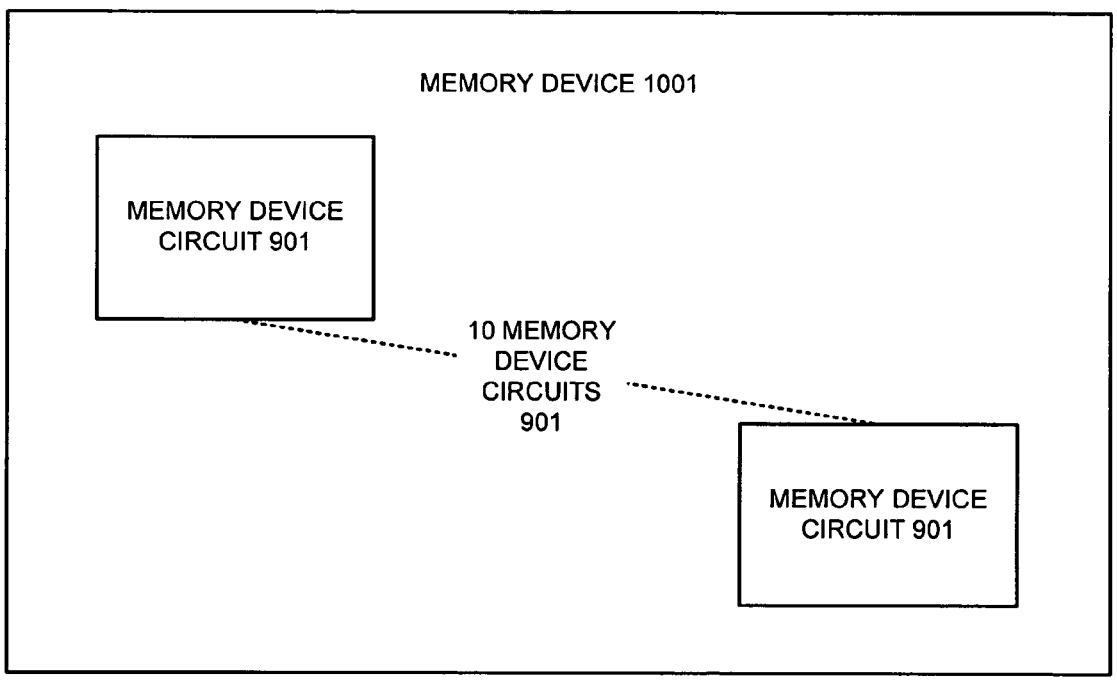

FIG. 10 then illustrates a memory device 1001 that contains 10 memory device circuits 901. If a comparison process were performed on the memory device 1001 in a "flat" manner (i.e., comparing each element of the memory device 1001 without using a logic injection process or an h-cell comparison process), then the memory would need to store information corresponding to the 60,000 elements making up the 10 memory device circuits 901. If, however, the user only has sufficient memory space to store information corresponding to 10,000 elements, then the user would need to repeat the comparison process 6 times.

By using a logic injection process according to various embodiments of the invention, however, the amount of memory space required to compare a single memory device circuit 901 will be reduced to that necessary to perform 1,000 comparison operations. Thus, by using a logic injection process according to various embodiments of the invention, the amount of memory space required to compare a single memory device 1001 will be reduced to that necessary to perform 10,000 comparison operations, and thus may be performed during a single comparison process. Still further, if the memory circuit 901 is designated as part of an h-cell pair, the amount of memory space required to compare a single memory device 1001 will be reduced to that necessary to perform only 1,009 comparison operations (i.e., 1000 comparison operation to compare the injection data objects of a single memory device circuit 901 to establish the equivalency of the h-cell pair, and 9 subsequent comparisons of the remaining memory device circuits 901 as h-cells).

When using a logic injection technique according to various embodiments of the invention with h-cell comparison processes, the logic injection technique may be applied to every h-cell. More particularly, each h-cell may be flattened (i.e., any cells within the h-cell are organized into their constituent components). Each h-cell may then be transformed according to conventional h-cell comparison processes (e.g., parallel devices are "collapsed" into a single representative device). The logic injection technique may then be applied to the flattened, transformed h-cell.

If, however, a circuit listing or a portion of a circuit listing does not contain any h-cells, then a logic injection technique according to various embodiments of the invention may still be applied to the components of the circuit listing (or portion thereof). Similarly, a logic injection technique according to various embodiments of the invention may still be applied to the components of the circuit listing (or portion thereof without any reference to or use of a conventional h-cell comparison process.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method of reducing a circuit listing, comprising:
    analyzing with a logic injection computing unit at least a portion of a circuit listing stored in a computer readable memory to identify occurrences of a predefined structure, the predefined structure made up of a plurality of circuit components;
    for each identified occurrence of the predefined structure, creating with the logic injection computing unit an injection data object corresponding to the plurality of components, and substituting the injection data object into the at least a portion of the circuit listing for the plurality of components; and
    comparing the portion of the circuit listing with a corresponding second circuit listing, where one of the circuit listing and second circuit listing is an original schematic for the plurality of circuit components, and the other of the circuit listing and the second circuit listing is a layout design based on the original schematic,
    wherein each injection data object includes at least one repeat information data object containing information common to multiple occurrences of the predefined structure, and a specific information data object containing information specific to the corresponding occurrence of the predefined structure.

2. The method recited in claim 1, further comprising: for each identified occurrence of the predefined structure, determining at least one property of the occurrence of the predefined structure, and storing the determined at least one property in the corresponding injection data object.

3. The method recited in claim 2, wherein the at least one property of the predefined structure is a property of a component among the plurality of circuit components making up the occurrence of the predefined structure.

4. The method recited in claim 3, wherein each injection data object further stores an identifier identifying the component.

5. The method recited in claim 3, wherein the component is a transistor, and the at least one property is a transistor width or a transistor length.

6. The method recited in claim 1, wherein each injection data object further includes a reference data object containing a first reference to the repeat information data object and a second reference to the specific information data object.

7. The method recited in claim 1, wherein each injection data object further includes an identification data object containing identifiers identifying each of the plurality of components making up the corresponding occurrence of the predefined structure.

8. The method recited in claim 7, wherein each injection data object further includes a reference data object containing a first pointer to the repeat information data object, a second pointer to the specific information data object, and a third pointer to the identification data object.

9. The method recited in claim 1, wherein the at least one repeat information data object includes a prototype repeat information data object containing prototype information common to each occurrence of the predefined structure, and a sub-prototype repeat information data object containing sub-prototype information common to multiple occurrences of the predefined structure but less than all occurrences of the predefined structure.

10. The method recited in claim 9, wherein the sub-prototype repeat information data object contains a reference to the prototype repeat information data object.

11. The method recited in claim 1, wherein the predefined structure is a memory circuit.

12. The method recited in claim 1, wherein the predefined structure is a logic gate.

13. The method recited in claim 12, wherein the predefined structure is selected from the group consisting of an inverter, a NAND gate, and a NOR gate.

14. The method recited in claim 1, wherein the at least a portion of a circuit listing is a hierarchical cell.

15. The method recited in claim 1, wherein the circuit listing is a netlist.

16. The method recited in claim 1, further comprising: repeating the steps recited in claim 1 using, in place of the predefined structure, a second structure made up of a second plurality of circuit components.

17. A computer readable memory storing instructions for performing the method recited in claim 1.

18. A method of claim 1, wherein comparing the portion of the circuit listing with a corresponding second circuit listing further comprises:
    comparing one of the injected data objects in the portion of the circuit listing with a corresponding injected data object in the second circuit listing.

19. A logic injection computing unit for reducing a circuit listing, comprising a processing unit and system memory storing computer readable instructions that, when executed by the processing unit, cause the logic injection computing unit to:
    store a predefined structure made up of a plurality of circuit components;
    analyze at least a portion of a circuit listing, and identify each occurrence of the predefined structure;
    create an injection data object corresponding to the plurality of components for each identified occurrence of the predefined structure; and
    substitute the created injection data object into the at least a portion of the circuit listing for the plurality of components,
    wherein each injection data object includes at least one repeat information data object containing information common to multiple occurrences of the predefined structure, and a specific information data object containing information specific to the corresponding occurrence of the predefined structure.

20. The tool recited in claim 19, wherein the computer readable instructions, when executed by the processing unit, further cause the logic injection computing unit to:
    determine at least one property for each occurrence of the predefined structure: and
    store the determined at least one property in the corresponding injection data object.

21. The tool recited in claim 20, wherein the at least one property for each occurrence of the predefined structure is a property of a component among the plurality of circuit components making up the occurrence of the predefined structure.

22. The tool recited in claim 19, wherein the predefined structure is a memory circuit.

23. The tool recited in claim 19, wherein the predefined structure is a logic gate.

24. The tool recited in claim 23, wherein the predefined structure is selected from the group consisting of an inverter, a NAND gate, and a NOR gate.

25. The tool recited in claim 19, wherein the at a least a portion of a circuit listing is a hierarchical cell.

26. The tool recited in claim 19, wherein the circuit listing is a netlist.

27. A method of comparing circuit listings, comprising:
    reducing a circuit listing of a layout design; and
    reducing a circuit listing of an original schematic for the layout design,
    wherein each reduction comprises:
        analyzing with a logic injection computing unit at least a portion of the circuit listing to identify occurrences of a predefined structure made up of a plurality of circuit components, and
        for each identified occurrence of the predefined structure, creating with the logic injection computing unit an injection data object corresponding to the plurality of components, and substituting the injection data object into the circuit listing for the plurality of components,
    wherein each injection data object includes at least one repeat information data object containing information common to multiple occurrences of the predefined structure, and a specific information data object containing information specific to the corresponding occurrence of the predefined structure.

28. A method, comprising:
    analyzing a circuit listing stored in a computer-readable memory to identify occurrences of a predefined structure made up of a plurality of circuit components;
    for each identified occurrence of the predefined structure, creating an injection data object corresponding to the plurality of components, and substituting the injection data object into the circuit listing stored in the computer-readable memory for the plurality of circuit components; and
    comparing the circuit listing with a corresponding second circuit listing, where one of the circuit listing and second circuit listing describes information in an original schematic for the plurality of circuit components, and the other of the circuit listing and the second circuit listing describes information in a circuit layout based on the original schematic,
    wherein each injection data object includes at least one repeat information data object containing information common to multiple occurrences of the predefined structure, and a specific information data object containing information specific to the corresponding occurrence of the predefined structure.

* * * * *